United States Patent [19]
Hwang et al.

[11] Patent Number: 6,020,761
[45] Date of Patent: Feb. 1, 2000

[54] INPUT BUFFERS AND CONTROLLING METHODS FOR INTEGRATED CIRCUIT MEMORY DEVICES THAT OPERATE WITH LOW VOLTAGE TRANSISTOR-TRANSISTOR LOGIC (LVTTL) AND WITH STUB SERIES TERMINATED TRANSCEIVER LOGIC (SSTL)

[75] Inventors: Sang-joon Hwang, Seoul; Kyung-woo Kang, Kyungki-do, both of Rep. of Korea

[73] Assignee: Samsung Electronics Co., Ltd., Rep. of Korea

[21] Appl. No.: 09/088,135

[22] Filed: Jun. 1, 1998

[30]  Foreign Application Priority Data

Oct. 13, 1997 [KR] Rep. of Korea ............... 97-52356

[51] Int. Cl.[7] .......................................... H03K 19/0175
[52] U.S. Cl. ...................................... 326/80; 326/70
[58] Field of Search ......................... 326/83, 86, 68, 326/70, 71, 80; 327/407, 405, 49, 50

[56]  References Cited

U.S. PATENT DOCUMENTS

| | | | |
|---|---|---|---|
| 5,530,379 | 6/1996 | Konishi et al. | 326/68 |
| 5,596,291 | 1/1997 | Runas | 327/108 |
| 5,598,122 | 1/1997 | McClure | 327/538 |
| 5,696,456 | 12/1997 | Lee | 326/70 |
| 5,736,871 | 4/1998 | Goto | 326/83 |

Primary Examiner—Michael Tokar
Assistant Examiner—Don Phu Le
Attorney, Agent, or Firm—Myers Bigel Sibley & Sajovec

[57] ABSTRACT

An input buffer that can operate with Low Voltage Transistor-Transistor Logic (LVTTL) and with Stub Series Terminated transceiver Logic (SSTL) includes a differential amplifier that differentially amplifies a reference voltage and an external input signal. A switching system is coupled to the differential amplifier, to supply an external power supply voltage to the differential amplifier under SSTL operating conditions and to supply an internal power supply voltage to the differential amplifier under LVTTL operating conditions. An internal power supply voltage generator is responsive to the external power supply voltage, to generate the internal power supply voltage therefrom. The internal power supply voltage generator supplies the internal power supply voltage to the switching system. The switching system preferably includes a first switch that supplies the external power supply voltage to the differential amplifier in response to an SSTL control signal. A second switch supplies the internal power supply voltage to the differential amplifier in response to an LVTTL control signal.

18 Claims, 1 Drawing Sheet

INPUT BUFFERS AND CONTROLLING METHODS FOR INTEGRATED CIRCUIT MEMORY DEVICES THAT OPERATE WITH LOW VOLTAGE TRANSISTOR-TRANSISTOR LOGIC (LVTTL) AND WITH STUB SERIES TERMINATED TRANSCEIVER LOGIC (SSTL)

FIELD OF THE INVENTION

This invention relates to integrated circuit memory devices and methods of controlling the same, and more particularly to input buffers for integrated circuit memory devices and methods of controlling the same.

BACKGROUND OF THE INVENTION

Synchronous dynamic random access memory devices, referred to as SDRAMs, are now widely being used in personal computers and other data processing systems. As is well known to those having skill in the art, an SDRAM uses a clock to synchronize signal input and output on a memory device. The clock is coordinated with the clock of a central processing unit or microprocessor, so that the timing of the memory device and the timing of the central processing unit are synchronous. An SDRAM can increase the overall system performance of a computer by reducing the time to execute commands and transmit data. SDRAMs may include an on-chip burst counter that can be used to increment column addresses for very fast burst access. To work with high clock speeds, SDRAMs may include two or more internal banks. This allows one bank to get ready for access while the other bank is being accessed. Thus, new memory accesses can be initiated before the preceding access has been completed.

SDRAMs use clock buffers, which is a form of an input buffer, to receive an external clock signal and generate an internal clock signal which in turn is used to control an output buffer. Accordingly, for an SDRAM, the time tSAC between receiving the external clock signal in the clock buffer and outputting data through the output buffer, and the time tOH for which previous data is maintained to fetch the output data, may be important parameters. However, when a tSAC path is designed to decrease tSAC of the SDRAM, the tOH margin may be reduced. Accordingly, in order to decrease the tSAC and ensure an adequate tOH margin, a change of data output speed according to a change of the power supply voltage VCC may be obtained by using an internal power supply voltage IVC in the clock buffer.

FIG. 1 is a circuit diagram of a conventional input buffer used as a clock buffer in an SDRAM. Referring to FIG. 1, a conventional input buffer includes a differential amplifier 11 that amplifies the difference between a reference voltage VREF and an external input signal INPUT. A switching portion 13 supplies an internal power supply voltage IVC to the differential amplifier 11 when a control signal PBUFC is active.

The differential amplifier portion 11 may be a conventional differential amplifier. The switching portion comprises a PMOS transistor P11 including a source to which the internal power supply voltage IVC is applied, a gate to which the control signal PBUFC is applied, and a drain connected to the differential amplifier 11. The internal power supply voltage IVC is generated by an internal power supply voltage generator of an SDRAM, using an external power supply voltage EVC, and has a predetermined level regardless of the external power supply voltage EVC.

It is also well known that SDRAMs can operate using Low Voltage Transistor-Transistor Logic (LVTTL) and with Stub Series Terminated transceiver Logic (SSTL). As is well known to those having skill in the art, both LVTTL and SSTL are bus termination techniques. SSTL was created by the JEDEC Committee as an upgrade for LVTTL. An SSTL-based SDRAM design can reduce the heat generated, as well as improve the performance thereof. See U.S. Pat. Nos. 5,696,456 to Lee entitled "Enhanced Low Voltage TTL Interface " and U.S. Pat. No. 5,530,379 to Konishi et al. entitled "Output Buffer Circuit That Can be Shared by a Plurality of Interfaces and a Semiconductor Device Using the Same".

Under LVTTL interface conditions of an SDRAM, the input signal INPUT and the reference voltage VREF received by the input buffer are maintained at a constant level even though the external power supply voltage EVC changes, to thereby allow the input buffer to operate normally. That is, since the internal power supply voltage IVC is maintained at a constant level and the reference voltage VREF and the input signal INPUT received by the gate of each of the NMOS transistors N11 and N12 of the differential amplifying portion 11 are maintained at a constant level, the PMOS transistors P12 and P13 and the NMOS transistors N11 and N12 of the differential amplifying portion 11 can operate normally.

However, under SSTL interface conditions, the input signal INPUT and the reference voltage VREF received by the input buffer may change according to the external power supply voltage EVC. Accordingly, the input buffer may not operate properly. That is, the internal power supply voltage IVC is maintained at a constant level and the input signal INPUT and the reference voltage VREF change according to the external power supply voltage EVC. Accordingly, the PMOS transistors P12 and P13 and the NMOS transistors N11 and N12, of the differential amplifing portion 11 may operate improperly. For example, when the input signal INPUT and the reference voltage VREF increase, the voltage between the gate and source of each of the PMOS transistors P12 and P13 may become lower than that of the NMOS transistors N11 and N12. Therefore, the output signal BIN of the differential amplifying portion 11 may remain at logic "low", so that the input buffer may operate improperly.

SUMMARY OF THE INVENTION

It is therefore an object of the present invention to provide improved input buffers for integrated circuit memory devices, and methods of controlling the same.

It is another object of the present invention to provide input buffers that can operate with Low Voltage Transistor-Transistor Logic (LVTTL) and with Stub Series Terminated transceiver Logic (SSTL), and methods of controlling the same.

These and other objects are provided, according to the present invention, by an input buffer for an integrated circuit memory device that operates with LVTTL and with SSTL, and that includes a differential amplifier that differentially amplifies a reference voltage and an external input signal. A switching system is coupled to the differential amplifier, to supply an external power supply voltage to the differential amplifier under SSTL operating conditions and to supply an internal power supply voltage to the differential amplifier under LVTTL operating conditions. Accordingly, the input buffer can operate correctly under both LVTTL and SSTL operating conditions.

An input buffer according to the invention also preferably includes an internal power supply voltage generator that is responsive to the external power supply voltage, to generate the internal power supply voltage therefrom. The internal power supply voltage generator supplies the internal power supply voltage to the switching system.

The switching system preferably includes a first switch that supplies the external power supply voltage to the differential amplifier in response to an SSTL control signal. A second switch supplies the internal power supply voltage to the differential amplifier in response to an LVTTL control signal.

The first switch preferably comprises a first PMOS transistor, connected between the external power supply voltage and the differential amplifier, and including a first gate that is responsive to the SSTL control signal. The second switch preferably comprises a second PMOS transistor, connected between the internal power supply voltage and the differential amplifier, and including a second gate that is responsive to the LVTTL control signal. The first PMOS transistor preferably includes a first well bias, and the second PMOS transistor preferably includes a second well bias. The external power supply is connected to both the first well bias and the second well bias.

Accordingly, an input buffer for an integrated circuit memory device is controlled, according to the present invention, by supplying an external power supply voltage to the differential amplifier under SSTL operating conditions and by supplying an internal power supply voltage to the differential amplifier under LVTTL operating conditions. The internal power supply voltage is preferably generated from the external power supply voltage.

It will also be understood that the present invention can be used with other integrated circuit buffers that include a differential amplifier and a switching system that supplies a first power supply voltage to the differential amplifier under a first operating condition, and that supplies a second power supply voltage to the differential amplifier under a second operating condition. Improved operations of integrated circuit buffers, and more particularly of input buffers for integrated circuit memory devices, may thereby be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1:
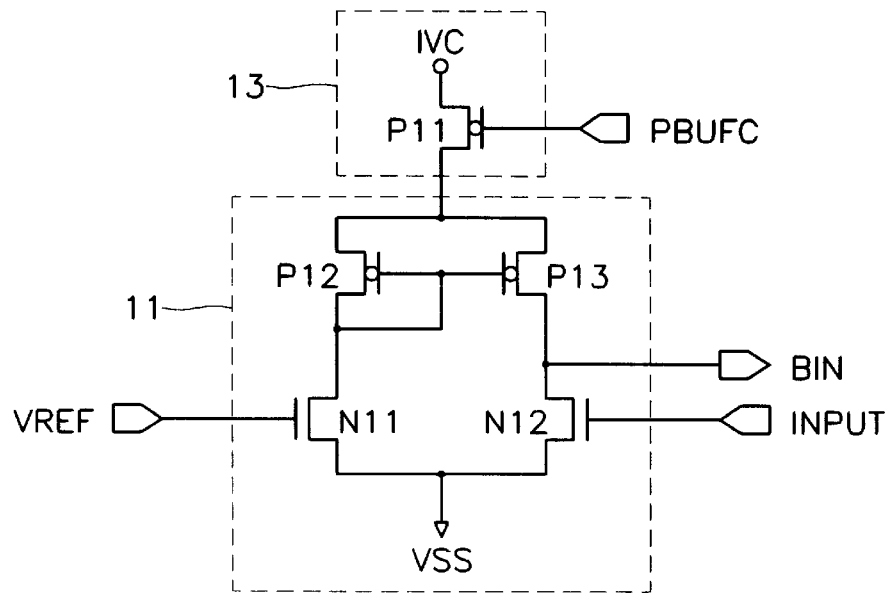
FIG. 1 is a circuit diagram of a conventional input buffer used as a clock buffer of an SDRAM.
Figure 2:
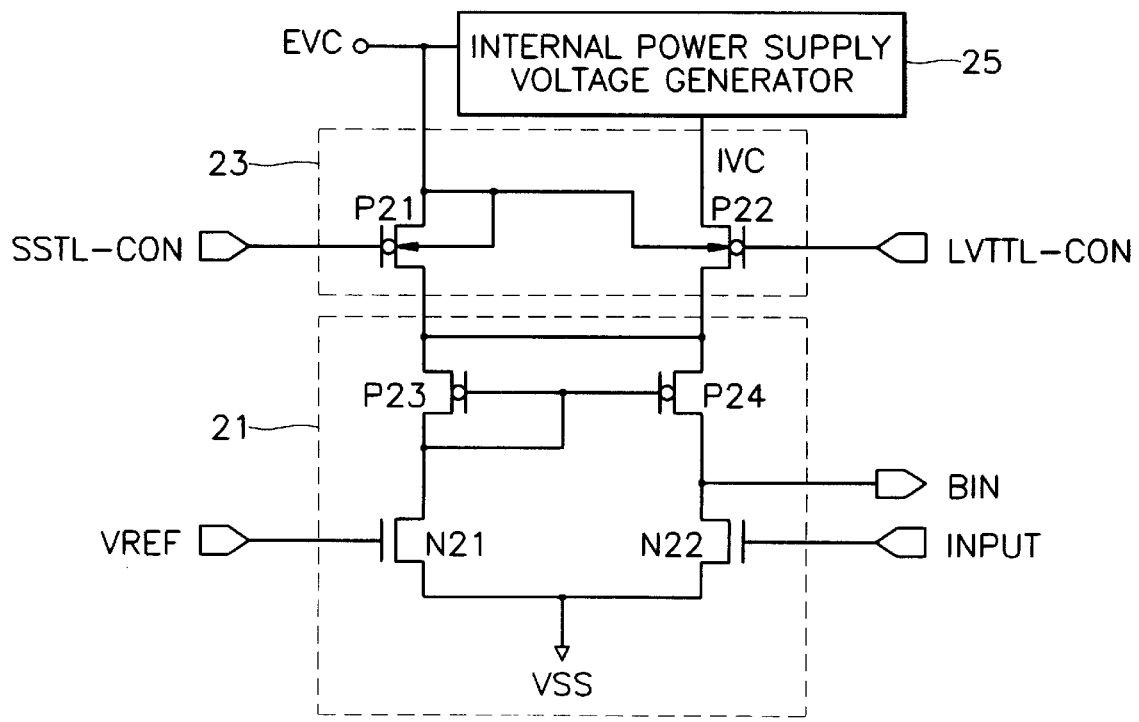
FIG. 2 is a circuit diagram of input buffers of integrated circuit memory devices according to the present invention.

Referring to FIG. 2, input buffers according to the present invention includes a differential amplifier 21 and a switching system 23.

The differential amplifier 21 amplifies the difference between a reference voltage VREF and an external input signal INPUT to produce an output BIN. The switching system 23 selects the external power supply voltage EVC to supply to the differential amplifier 21 under SSTL interface conditions, where the reference voltage VREF and the input signal INPUT change according to the external power supply voltage EVC. Also, the switching system 23 selects the internal power supply voltage IVC to supply to the differential amplifier 21 under LVTTL interface conditions, where the reference voltage VREF and the input signal INPUT are maintained at a constant level even though the external power supply voltage EVC changes.

The external power supply voltage EVC is applied from external to the integrated circuit memory device. The internal power supply voltage IVC is generated by an internal power supply voltage generator 25 of the memory device, using the external power supply voltage EVC, and is maintained at a constant level despite specified fluxations of the external power supply voltage EVC.

The differential amplifier 21 may be a conventional differential amplifier. The switching system 23 includes a first switch P21 for supplying the external power supply voltage EVC to the differential amplifier 21 when a first control signal SSTL-CON is active, and a second switch P22 for supplying the internal power supply voltage IVC to the differential amplifier 21 when a second control signal LVTTL-CON is active. The first control signal SSTL-CON is activated to logic "low" under SSTL interface conditions, and the second control signal LVTTL-CON is activated to logic "low" under LVTTL interface conditions.

The first switch P21 includes a PMOS transistor having a source to which the external power supply voltage EVC is applied, a gate to which the first control signal SSTL-CON is applied, and a drain connected to the differential amplifier 21. The second switch P22 includes a PMOS transistor having a source to which the internal power supply voltage IVC is applied, a gate to which the second control signal LVTTL-CON is applied, and a drain connected to the differential amplifier 21.

As also shown in FIG. 2, the external power supply voltage EVC is used as a well bias of the PMOS transistors P21 and P22. For example, under the SSTL interface conditions, when the first control signal SSTL-CON is activated to logic "low", the external power supply voltage EVC is supplied to the drain of each of the PMOS transistors P21, P22. However, the external power supply voltage EVC is higher than the internal power supply voltage IVC, so that if the internal power supply voltage IVC is used as a well bias of the PMOS transistor P22, a forward bias would be generated between the drain of the PMOS transistor P22 and a well, to thereby allow malfunction of the input buffer. Accordingly, the external power supply voltage EVC is used as the well bias of the PMOS transistors P21 and P22, to prevent the forward bias between the drain of the PMOS transistor P22 and the well.

Operations of the input buffer of FIG. 2 will now be described. Under LVTTL interface conditions of the memory device, the first control signal SSTL-CON is inactivated to logic "high", and the second control signal LVTTL-CON is activated to logic "low". Thus, the first switch P21 is turned off, and the second switch P22 is turned on, to thereby supply the internal power supply voltage IVC to the differential amplifier 21. Under the LVTTL interface conditions, although the external power supply voltage EVC changes, the input signal INPUT and the reference voltage VREF received by the differential amplifier 21 maintain a constant level and the internal power supply voltage IVC applied to the differential amplifier 21 maintains a constant level. Therefore, the output signal BIN of the input buffer is affected little by changes in the external power supply voltage EVC. The PMOS transistors P23 and P24 and the NMOS transistors N21 and N22 of the differential amplifier 21 thus can operate properly.

Under SSTL interface conditions of the device, the first control signal SSTL-CON is activated to logic "low", and the second control signal LVTTL-CON is inactivated to logic "high". Accordingly, the first switch P21 is turned on and the second switch P22 is turned off, to thereby supply the external power supply voltage EVC to the differential amplifier 21. Under SSTL interface conditions, the input signal INPUT and the reference voltage VREF received by the differential amplifier 21 change according to changes of the external power supply voltage EVC, and the external power supply voltage EVC applied to the differential amplifier 21 also changes, so that the output signal BIN of the input buffer is affected little by the changes of the external power supply voltage EVC.

For example, under SSTL interface conditions, if the external power supply voltage EVC increases, to thereby increase the voltage of the input signal INPUT and the reference voltage VREF, then the voltage between the gate and source of each of the NMOS transistors N21 and N22 and the PMOS transistors P23 and P24 also increases. Accordingly, the PMOS transistors P23 and P24 and the NMOS transistors N21 and N22 operate in the same trend, and thus the output signal BIN of the input buffer is affected little by changes in the external power supply voltage EVC.

According to the present invention, under LVTTL interface conditions, where the reference voltage and the input signal maintain a constant level although the external power supply voltage changes, the internal power supply voltage maintained at a constant level is used for a power supply voltage. On the other hand, under SSTL interface conditions, where the reference voltage and the input signal change according to the external power supply voltage, the external power supply voltage is used for the power supply voltage. Accordingly, the input buffer can operate stably under both the LVTTL and SSTL interface conditions.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An input buffer for an integrated circuit memory device that operates with Low Voltage Transistor-Transistor Logic (LVTTL) and with Stub Series Terminated transceiver Logic (SSTL), the input buffer comprising:
   a differential amplifier that differentially amplifies a reference voltage and an external input signal; and
   a switching system that is coupled to the differential amplifier, to supply an external power supply voltage to the differential amplifier under SSTL operating conditions, and to supply an internal power supply voltage to the differential amplifier under LVTTL operating conditions.

2. An input buffer according to claim 1 further comprising:
   an internal power supply voltage generator that is responsive to the external power supply voltage to generate the internal power supply voltage therefrom, and to supply the internal power supply voltage to the switching system.

3. An input buffer according to claim 1 wherein the switching system comprises:
   a first switch that supplies the external power supply voltage to the differential amplifier in response to an SSTL control signal; and
   a second switch that supplies the internal power supply voltage to the differential amplifier in response to an LVTTL control signal.

4. An input buffer according to claim 3:
   wherein the first switch comprises a first PMOS transistor, connected between the external power supply voltage and the differential amplifier, and including a first gate that is responsive to the SSTL control signal; and
   wherein the second switch comprises a second PMOS transistor, connected between the internal power supply voltage and the differential amplifier, and including a second gate that is responsive to the LVTTL control signal.

5. An input buffer according to claim 4 wherein the first PMOS transistor includes a first well bias, wherein the second PMOS transistor includes a second well bias, and wherein the external power supply is connected to the first well bias and to the second well bias.

6. An input buffer for an integrated circuit memory device that operates with Low Voltage Transistor-Transistor Logic (LVTTL) and with Stub Series Terminated transceiver Logic (SSTL), the input buffer comprising:
   means for differentially amplifying a reference voltage and an external input signal; and
   means for supplying an external power supply voltage to the means for differentially amplifying under SSTL operating conditions, and for supplying an internal power supply voltage to the means for differentially amplifying under LVTTL operating conditions.

7. An input buffer according to claim 6 further comprising:
   means for generating the internal power supply voltage from the external power supply voltage, and for providing the internal power supply voltage to the means for supplying.

8. An input buffer according to claim 6 wherein the means for supplying comprises:
   first means for supplying the external power supply voltage to the means for differentially amplifying in response to an SSTL control signal; and
   second means for supplying the internal power supply voltage to the means for differentially amplifying in response to an LVTTL control signal.

9. An input buffer according to claim 8:
   wherein the first means for supplying comprises a first PMOS transistor, connected between the external power supply voltage and the means for differentially amplifying, and including a first gate that is responsive to the SSTL control signal; and
   wherein the second means for supplying comprises a second PMOS transistor, connected between the internal power supply voltage and the means for differentially amplifying, and including a second gate that is responsive to the LVTTL control signal.

10. An input buffer according to claim 9 wherein the first PMOS transistor includes a first well bias, wherein the second PMOS transistor includes a second well bias, and wherein the external power supply is connected to the first well bias and to the second well bias.

11. A method of controlling an input buffer for an integrated circuit memory device that operates with Low Voltage Transistor-Transistor Logic (LVTTL) and with Stub Series Terminated transceiver Logic (SSTL), the input buffer including a differential amplifier that differentially amplifies a reference voltage and an external input signal, the controlling method comprising the steps of:

supplying an external power supply voltage to the differential amplifier under SSTL operating conditions; and supplying an internal power supply voltage to the differential amplifier under LVTTL operating conditions.

12. A method according to claim 11 further comprising the step of:

generating the internal power supply voltage from the external power supply voltage.

13. A method according to claim 11:

wherein the step of supplying an external power supply voltage comprises the step of supplying the external power supply voltage to the differential amplifier in response to an SSTL control signal; and wherein the step of supplying an internal power supply voltage comprises the step of supplying the internal power supply voltage to the differential amplifier in response to an LVTTL control signal.

14. An integrated circuit buffer comprising:

a differential amplifier that differentially amplifies a reference voltage and an external signal; and a switching system that is coupled to the differential amplifier, to supply a first power supply voltage to the differential amplifier under a first operating condition, and to supply a second power supply voltage to the differential amplifier under a second operating condition.

15. A buffer according to claim 14 further comprising:

a power supply voltage generator that is responsive to the first power supply voltage to generate the second power supply voltage therefrom, and to supply the second power supply voltage to the switching system.

16. A buffer according to claim 14 wherein the switching system comprises:

a first switch that supplies the first power supply voltage to the differential amplifier in response to a first control signal; and a second switch that supplies the second power supply voltage to the differential amplifier in response to a second control signal.

17. A buffer according to claim 16:

wherein the first switch comprises a first PMOS transistor, connected between the first power supply voltage and the differential amplifier, and including a first gate that is responsive to the first control signal; and wherein the second switch comprises a second PMOS transistor, connected between the second power supply voltage and the differential amplifier, and including a second gate that is responsive to the second control signal.

18. An input buffer according to claim 17 wherein the first PMOS transistor includes a first well bias, wherein the second PMOS transistor includes a second well bias, and wherein the first power supply is connected to the first well bias and to the second well bias.

* * * * *